United States Patent
Chraim et al.

(10) Patent No.: US 9,547,026 B1
(45) Date of Patent: Jan. 17, 2017

(54) PLUG-THROUGH ENERGY MONITOR

(71) Applicants: Fabien Chraim, Berkeley, CA (US); Michael Lorek, Berkeley, CA (US)

(72) Inventors: Fabien Chraim, Berkeley, CA (US); Michael Lorek, Addison, TX (US); Kristofer S. J. Pister, Berkeley, CA (US)

( * ) Notice: Subject to any disclaimer, the term of this patent is extended or adjusted under 35 U.S.C. 154(b) by 150 days.

(21) Appl. No.: 14/143,875

(22) Filed: Dec. 30, 2013

Related U.S. Application Data

(60) Provisional application No. 61/747,053, filed on Dec. 28, 2012, provisional application No. 61/921,827, filed on Dec. 30, 2013.

(51) Int. Cl.
 G01R 19/00 (2006.01)
 G01R 21/00 (2006.01)
 H01L 21/00 (2006.01)

(52) U.S. Cl.
 CPC .............. *G01R 21/002* (2013.01); *H01L 21/00* (2013.01); *H01L 2221/00* (2013.01); *H05K 999/00* (2013.01)

(58) Field of Classification Search
 CPC ........ H01L 21/00; H01L 2221/00; G01R 1/00; H02M 1/00; H05K 1/00; H05K 2201/00; H05K 999/00
 See application file for complete search history.

(56) References Cited

U.S. PATENT DOCUMENTS

| | | | |
|---|---|---|---|
| 4,924,404 A | 5/1990 | Reinke, Jr. | |
| 5,942,895 A | 8/1999 | Popovic | |
| 6,005,383 A | 12/1999 | Savary | |
| 6,095,850 A | 8/2000 | Liu | |
| 6,462,536 B1* | 10/2002 | Mednikov | G01D 5/202 324/207.16 |
| 7,274,187 B2* | 9/2007 | Loy | G01R 22/065 324/142 |
| 8,558,710 B1* | 10/2013 | Nitz | 340/657 |
| 2003/0090356 A1 | 5/2003 | Salto | |
| 2004/0155644 A1* | 8/2004 | Stauth | G01R 15/205 324/117 R |
| 2008/0048642 A1* | 2/2008 | Aratani | G01R 15/202 324/117 H |
| 2009/0001962 A1 | 1/2009 | Dupuis et al. | |
| 2009/0284248 A1* | 11/2009 | Etter | G01R 15/181 324/126 |
| 2012/0005498 A1* | 1/2012 | Huo et al. | 713/310 |
| 2012/0074929 A1 | 3/2012 | Wobschall | |
| 2012/0081110 A1* | 4/2012 | Racz | G01R 15/202 324/252 |
| 2012/0215470 A1 | 8/2012 | Maguire | |
| 2013/0183043 A1* | 7/2013 | Elberbaum | 398/115 |
| 2014/0167786 A1* | 6/2014 | Gutierrez et al. | 324/654 |

* cited by examiner

*Primary Examiner* — Jermele M Hollington
*Assistant Examiner* — Temilade Rhodes-Vivour
(74) *Attorney, Agent, or Firm* — North Ealing LLC; Vandana Koelsch

(57) ABSTRACT

The magnetic field in the vicinity of a conductor can be sensed by wire loops to measure the current in the nearby conductor. A sensor in a printed circuit board can detect and measure currents flowing through the PCB itself, yielding a thin, inexpensive, scalable solution for energy monitoring.

11 Claims, 2 Drawing Sheets

US 9,547,026 B1

PLUG-THROUGH ENERGY MONITOR

CROSS REFERENCE TO RELATED APPLICATIONS

The present invention claims the benefit of, priority to, and incorporates by reference, in their entirety, the follow provisional patent applications under 35 U.S.C. Section 119(e): 61/747,053, entitled Plug-Through Energy Sensor filed Dec. 28, 2012 and 61/921,827, Plug-Through Energy Monitor filed Dec. 30, 2013.

FIELD OF INVENTION

The present invention is directed to a method, system, and apparatus for an energy sensor using a non-intrusive, magnetic-field-based current sensor on a printed circuit board (PCB).

DISCUSSION OF THE BACKGROUND

Energy monitoring, in its known and common usage, as a unique sensing point for an entire unit, such as a Smart Meter, has many limitations. For example, it is very difficult to track the behavior of one piece of equipment or appliance over time, because only the aggregate energy consumption is recorded, making it difficult to isolate that equipment. Additionally, appliance manufacturers have very little data concerning the way with which the users employ these appliances. This information, if available, would lead to more user-friendly and more energy efficient appliances. With the advent of the Smart Grid, real-time energy consumption data from specific appliances becomes necessary to better distribute the limited resources generated by the utility companies.

There have been some attempts in the prior art at providing a plug-level energy monitoring solution. However, most of the products on the market today use some sort of resistive sensor, which breaks the current path from the cord to the wall outlet. Moreover, this method of energy monitoring dissipates power and makes the sensor bulky and expensive, rendering it unattractive for the users. Additionally, the energy consumption of the sensor itself grows with the consumption of the equipment or appliance. Though this may seem insignificant in the context of one or two instruments, but when scaling this technology to every outlet in every residence or office it presents a major obstacle for adoption.

The present invention is an inexpensive and scalable solution for the plug-level energy monitoring problem. With many integration points, it is a very slim device that allows continuously measuring the energy consumption of the equipment or appliance, without breaking the current path to the wall. Additional benefits include (a) no additional series resistance to be inserted in the circuit for current sensing, which can save a significant amount of power for certain loads; and (b) the advantage of incorporating the sensor into PCB allows the use of standard manufacturing process, reducing component count and costs. Furthermore, in certain embodiments, the distance between a conductor and sensor can be fixed by PCB design, thereby mitigating concerns related to calibration for the distance between conductor and sensor.

BRIEF DESCRIPTION OF THE DRAWINGS

The following description, given with respect to the attached drawings, may be better understood with reference to the non-limiting examples of the drawings, wherein.

DISCUSSION OF THE PREFERRED EMBODIMENTS

An embodiment of the invention uses a printed-circuit-board (PCB) device, which features an inductive sensor printed in between the prongs of any electrical equipment. This sensor allows a dramatic reduction in the thickness of the measuring instrument, as compared to other resistive-based sensors, as well as significant reduction in cost. Through magnetic coupling, the sensor observes a voltage induced at its terminals that is proportional to the current consumed by the equipment/appliance plugged into the wall.

An associated conditioning circuit is made up of filters, amplifiers and a digital-to-analog converter which can make the data available wirelessly, such as via Radio-Frequency messages, or through a wired serial digital interface The invention can be integrated into outlets, can be combined with the equipment's electrical cord, or can simply be placed as an independent component between the cord and the outlet. These features make the Plug-Through Energy Monitor an ideal candidate for ubiquitous plug-level energy monitoring.

Figure 1:
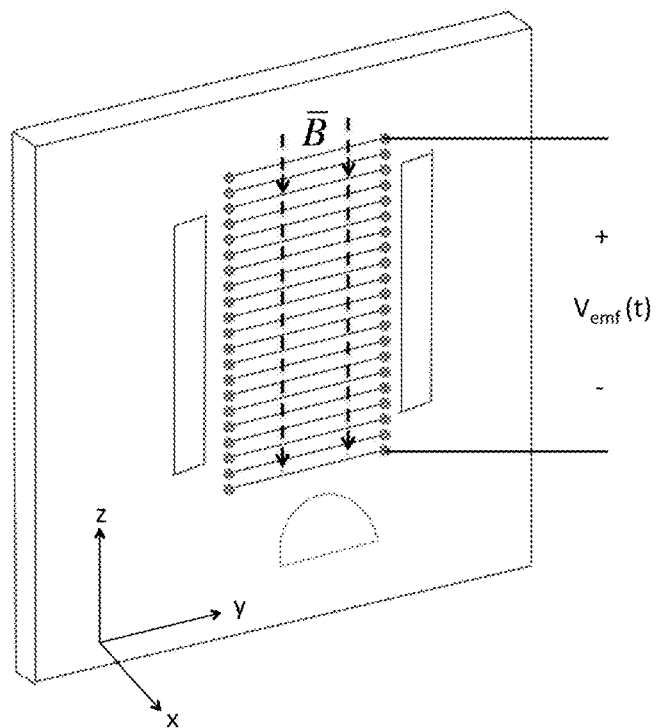
FIG. 1 is conceptual drawing of an exemplary PCB.

As shown in FIG. 1, an exemplary drawing of a PCB of the present invention, an embodiment of the invention may be designed with holes for various conductors and a current-sensor PCB coil. For a plug-through magnetic-field current sensor, the magnetic field must be detected in the plane of the PCB, such as the y-z plane in FIG. 1. The magnetic field sensor in this invention consists of multiple closed loops of wire that are sensitive to magnetic fields in the plane of the PCB. The aforementioned wire loops are fabricated into the circuit board itself as a series of PCB traces and layer-layer vias. This creates a number of wire loops forming a coil (solenoid) with its main axis in the plane of the PCB (z-axis in FIG. 1). According to Faraday's law, a voltage is induced in this coil due to a changing magnetic field in the z direction of the sensor PCB in FIG. 1. Therefore, this in-PCB coil is capable of sensing magnetic fields generated by currents flowing perpendicular to the PCB device.

For example, for a loop of infinitely thin wire, and assuming the magnetic flux density is constant in the z-direction throughout the region of sensor loops, the magnetic field can be detected using the following equation, where $\mu$ is the magnetic permeability, N is the number of wire loops, Aloop is the area of one loop, r is the distance between the conductor and wire loops, and l(t) is the current through the conductor.

$$B(t) = \frac{\mu I(t)}{2\pi r}$$

$$\phi_{loop}(t) = \int\int_S B(t) \cdot dS = B(t) \cdot A_{loop}$$

$$v_{emf}(t) = -\frac{d\phi(t)}{dt} = -NA_{loop}\frac{dB(t)}{dt} = \frac{\mu A_{loop}}{2\pi r}\frac{dI(t)}{dt}.$$

Alternative methods of fabricating the magnetic-field detection include placing the sensor within the PCB irrespective of the location of the conductor. Furthermore, the sensitivity of the magnetic field sensor may be improved by inter alia, adding ferromagnetic materials to increase magnetic flux density in the PCB and thus increase the sensor's output voltage signal. The sensitivity of the sensor can also be increased by maximizing the area of the wire loops relative to the current carrying conductor orientation. This can potentially be done using non-standard PCB thicknesses, or PCB fabrication processes with small vias and/or low minimum line/space requirements.

For use in plug load sensing applications, the sensor PCB can be placed in many different locations throughout the flow of current. The sensor can be a standalone device placed between the standard power plug and the wall power outlet. A plug load's power plug consists of two current-carrying conductors, and often a ground connection. Such a power plug can be plugged through the previously detailed in-PCB current sensor, and the plug load current can be measured. While power plugs vary between countries, the PCB can be redesigned to account for different plug geometries. For maximum sense signal to PCB area, the sensor coil should be placed between the two current-carrying conductors due to the summation of magnetic fields in this region from both currents.

Figure 2:
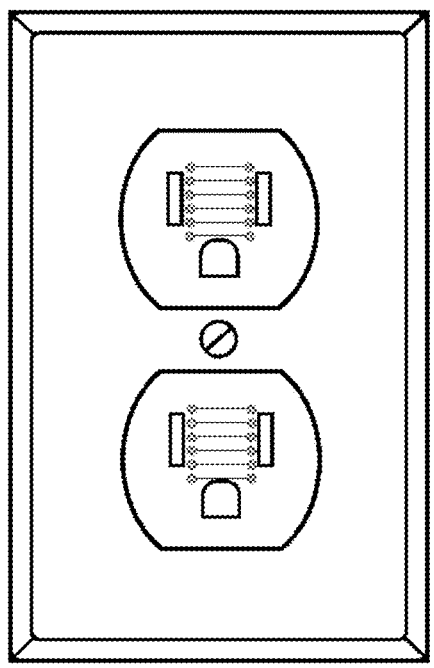
FIG. 2 is an exemplary face plate using an embodiment of the invention.
Figure 3:
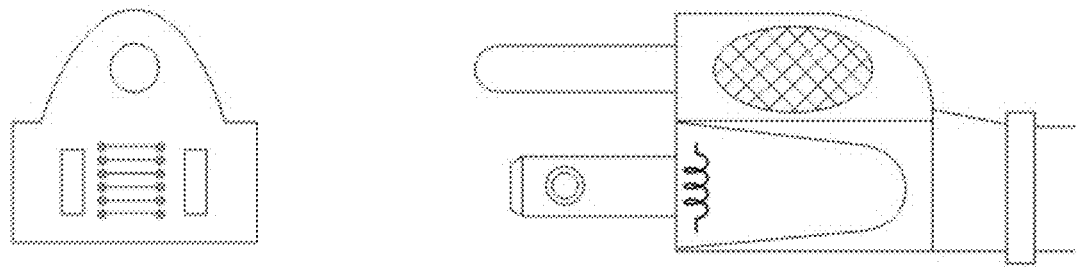
FIG. 3 is an exemplary power plug incorporating an embodiment of the invention.

The sensor PCB can also be built into the wall outlet faceplate shown in FIG. 2. The sensor can also be designed into the wall outlet electrical fixture itself for current sensing/energy monitoring of one or all of the outlets. A multi-plug power strip or surge protector could be integrated with multiple current/energy sensors. The sensor PCB could also be built into a plug load's power plug itself as shown in FIG. 3. The sensor PCB could also be built into an electrical device or appliance's housing itself, elsewhere to its external power cord.

Analog and/or digital electronics for subsequent signal processing and communication can be assembled into the same PCB substrate. Thus, the PCB may include further circuitry such as a power supply, an amplifier to boost the signal coming from the sensor, and a microcontroller with a radio to send the data to either a gateway or a master sensor which then would relay the information to a remote location.

In order to calculate the real power being dissipated in an electric load, the voltage across the load and current flowing through it must be known. While current sensing can be more difficult, voltage sensing can be done in a simple yet effective way. The output of the current sensor coil is a voltage signal that is likely very small in amplitude in comparison to an analog to digital converter's (ADC) least significant bit (LSB) size. Thus, the current sense signal may be amplified before sampling. A low-noise operational amplifier can be connected in a standard inverting amplifier configuration to increase the magnitude of the signal's voltage. The addition of a capacitor in feedback introduces a low-pass frequency response for noise reduction and anti-aliasing. Multiple inverting amplifier stages can be connected in cascade to obtain very high gain before sampling the analog current sense signal with an ADC.

A resistive voltage divider between the positive and neutral supply voltage conductors can be used to decrease the AC amplitude of the signal. This is necessary to generate a signal indicative of the AC voltage across the load that can be sampled without saturating the ADC. Alternatively, the voltage across the load could also be sensed capacitively through the electric field between the current-carrying conductor and a separate nearby pickup/sensing conductor. Once the time-domain waveforms for the voltage across the load and the current flowing through it are acquired, the real power dissipated in the load can be calculated. The multiplication of the voltage and current waveforms can be done in the analog or digital domains. The output of this multiplication is the instantaneous power dissipation as a function of time. This waveform can then be averaged to find the average real power dissipated.

Figure 4:
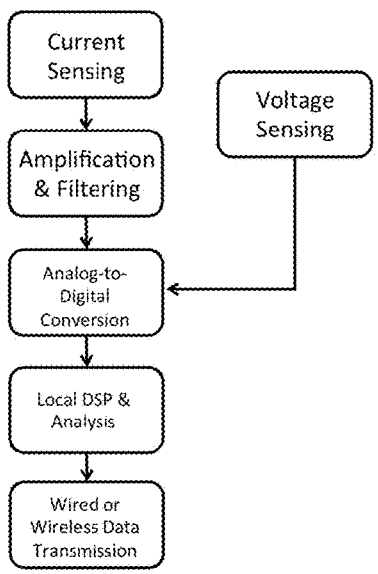
FIG. 4 is an exemplary system diagram.

FIG. 4 illustrates generally the system for measurement of power dissipation. First, the sensor detects the current, amplifies that signal, and voltage is determined. The output is analyzed and may be transmitted, for example to a cloud application, for further analysis.

Figure 5:
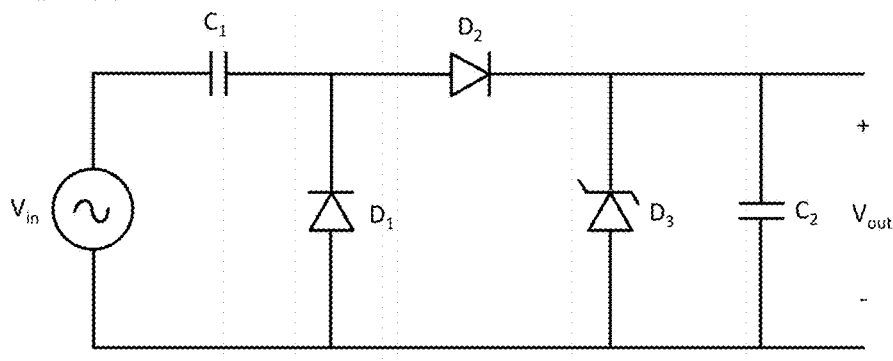
FIG. 5 is an exemplary power supply circuit.

The circuit in FIG. 5 can be used as a low-cost power supply for powering analog and digital circuits on the PCB from a high-voltage AC voltage source. Generally, the power supply circuit takes the power that is supplied by the grid and converts it from an AC voltage source to a DC voltage source. The rectifier uses diodes to cut the AC voltage to the specified range, and the capacitors dampen the transient effects. The amplification circuit amplifies the signal from the current sensor so that it can be read by the Analog-to-Digital Converter (ADC) on the microcontroller. This power supply circuit consists of two diodes, two capacitors, and one Zener diode. The power supply circuit rectifies an AC input voltage and generates a quasi-DC output voltage. The DC output voltage is adjustable and set by the reverse-bias turn-on voltage of the Zener diode D3. The average output current capability is set by the value of capacitor C1 and the input voltage amplitude. The value of capacitor C2 can be chosen to meet the transient current step requirements of subsequent load circuits. The capacitors and diodes can be optimized for output current requirements and further optimized to reduce the footprint and thickness of the PCB while meeting system level performance specifications.

The PCB-based current sensor can thus be used as a standalone device or together with other technologies for an all-in-one energy monitoring device.

While certain configurations of structures have been illustrated for the purposes of presenting the basic structures of the present invention, one of ordinary skill in the art will appreciate that other variations are possible which would still fall within the scope of the appended claims.

The invention claimed is:

1. A current monitor, comprising:
   a. a circuit board with a current sensor comprised of one or more inductive pickup coils of wire loops, the area inside the loops situated at an angle to the plane of the board;
   b. at least two recesses in the board from which conductors are removably inserted;
   c. wherein the pickup coil is located between the recesses in the board;
   d. wherein, the conductors are current-carrying,
   e. wherein the currents in pairs of conductors are of the same magnitude but flowing in opposite directions;
   f. wherein the pickup coil is sensitive to a magnetic field created by the flow of current; and
   g. wherein the pickup coil generates a signal proportional to the currents flowing through the plane of the circuit board;
   h. wherein the pickup coil generates the signal continuously; and
   i. wherein the circuit board is a printed circuit board.

2. The current monitor of claim 1, wherein the distance between the conductor and the pickup coil is fixed, thereby eliminating the need for multiple unique calibration profiles to account for the geometry between the coil and the conductor.

3. The current monitor of claim 1, wherein the current sensor is removably attached to the faceplate of an electrical outlet.

4. The current monitor of claim 1, wherein the current sensor is behind the faceplate of an electrical outlet.

5. The current monitor of claim 1, wherein the current sensor is integrated with an electrical outlet.

6. The current monitor of claim 1, wherein multiple current sensors are integrated into a power strip of multiple outlets.

7. The current monitor of claim 1 wherein the signal is amplified.

8. A system for measuring energy consumption comprising
   a. a current monitor of claim 1 that produces signal data;
   b. a circuit to measure the voltage at the current-carrying conductors of claim 1 that produces signal data;
   c. analog and/or digital circuitry for processing of signal data;
   d. a power-supply for powering the analog and/or digital circuitry;
   e. wireless communication of the processed sensor data to another device.

9. A current monitor, comprising:
   a. a circuit board with a current sensor comprised of one or more inductive pickup coils of wire loops, the area inside the loops situated at an angle to the plane of the board;
   b. at least two recesses in the board from which conductors are removably inserted;
   c. wherein, the conductors are current-carrying,
   d. wherein the currents in pairs of conductors are of the same magnitude but flowing in opposite directions;
   e. wherein the pickup coil is sensitive to a magnetic field created by the flow of current;
   f. wherein the pickup coil generates a signal proportional to the currents flowing through the plane of the circuit board.

10. A plug through current monitor, comprising:
    a. a printed circuit board with a current sensor of one or more inductive pickup coils of wire loops, the area inside the loops situated at an angle to the plane of the board;
    b. wherein the pickup coil is sensitive to a magnetic field created by the flow of current;
    c. wherein the pickup coil generates a signal proportional to the currents flowing through the plane of the circuit board;
    d. wherein two or more conductors are removably inserted into recesses of the board;
    e. wherein the pickup coil loops are printed radially around each of the recesses in the board;
    f. wherein the currents in pairs of conductors are of the same magnitude but flowing in opposite directions;
    g. wherein the printed circuit board is integrated with an electrical outlet's faceplate; and
    h. wherein the faceplate is removably attached to an electric outlet.

11. A plug through current monitor, comprising:
    a. a printed circuit board with a current sensor of one or more inductive pickup coils of wire loops, the area inside the loops situated at an angle to the plane of the board;
    b. wherein the pickup coil is sensitive to a magnetic field created by the flow of Current;
    c. wherein the pickup coil generates a signal proportional to the currents flowing through the plane of the circuit board;
    d. wherein two or more conductors are inserted into recesses of the board;
    e. wherein the currents in pairs of conductors are of the same magnitude but flowing in opposite directions;
    f. wherein the printed circuit board is integrated with an electrical outlet's faceplate; and
    g. wherein the faceplate is removably attached to an electric outlet.

* * * * *